United States Patent [19]
Tanaka et al.

[11] Patent Number: 6,077,647
[45] Date of Patent: Jun. 20, 2000

[54] PHOTOSENSITIVE RESIN COMPOSITION, PHOTOSENSITIVE FILM AND PROCESS FOR PREPARING FLUORESCENT PATTERN USING THE SAME, AND PHOSPHOR SUBJECTED TO SURFACE TREATMENT AND PROCESS FOR PREPARING THE SAME

[75] Inventors: Hiroyuki Tanaka, Mito; Hideyasu Tsuiki, Hitachinaka; Takeshi Nojiri, Iwama-machi; Koichi Kamijima, Hitachi; Seiji Tai, Hitachi; Seikichi Tanno, Hitachi; Hajime Kakumaru, Hitachi, all of Japan

[73] Assignee: Hitachi Chemical Co., Ltd., Tokyo, Japan

[21] Appl. No.: 09/173,008

[22] Filed: Oct. 15, 1998

Related U.S. Application Data

[62] Division of application No. 08/729,164, Oct. 11, 1996, Pat. No. 5,858,616.

[30] Foreign Application Priority Data

Oct. 13, 1995 [JP] Japan .................................. 7-265557
Nov. 2, 1995 [JP] Japan .................................. 7-285790
Nov. 2, 1995 [JP] Japan .................................. 7-285791

[51] Int. Cl.[7] ........................... G03F 7/032; C09K 11/08; H01J 17/49; H01J 9/00

[52] U.S. Cl. ................................ 430/281.1; 252/301.4 R; 313/582; 445/24

[58] Field of Search .................................. 430/28, 281.1; 445/24; 252/301.4 R; 313/582

[56] References Cited

PUBLICATIONS

Japanese Patent Abstract of JP 6–273925, Sep. 1994.

*Primary Examiner*—Janet Baxter
*Assistant Examiner*—Rosemary Ashton
*Attorney, Agent, or Firm*—Antonelli, Terry, Stout & Kraus, LLP

[57] ABSTRACT

Disclosed are a photosensitive resin composition which comprises:

(A) a compound having a carboxyl group;
(B) a resin having a carboxyl group;
(C) a photopolymerizable unsaturated compound having an ethylenic unsaturated group;
(D) a photopolymerization initiator which produces free radical by irradiation of active light; and
(E) a phosphor, a photosensitive film and a process for preparing a fluorescent pattern using the same, and a phosphor subjected to surface treatment and a process for preparing the same.

10 Claims, 4 Drawing Sheets

PHOTOSENSITIVE RESIN COMPOSITION, PHOTOSENSITIVE FILM AND PROCESS FOR PREPARING FLUORESCENT PATTERN USING THE SAME, AND PHOSPHOR SUBJECTED TO SURFACE TREATMENT AND PROCESS FOR PREPARING THE SAME

CROSS REFERENCE TO RELATED APPLICATION

This application is a divisional application of Ser. No 08/729,164, filed Oct. 11, 1996, U.S. Pat. No. 5,858,616.

BACKGROUND OF THE INVENTION

This invention relates to a photosensitive resin composition, a photosensitive film and a process for preparing a fluorescent pattern using the same, and a phosphor subjected to surface treatment and a process for preparing the same.

In the prior art, as one of flat plate displays, there has been known a plasma display panel (hereinafter referred to as "PDP") which enables multicolor display by providing a phosphor which emits light by plasma discharge.

In such PDP, flat front plate and back plate comprising glass are arranged in parallel with each other and facing to each other, both of the plates are retained at a certain interval by a cell barrier provided therebetween, and PDP has a structure that discharge is effected in a space surrounded with the front plate, the back plate and the cell barrier.

In such a cell, a phosphor is coated for display, and by discharge, the phosphor emits light by UV ray generated from filler gas, and the light can be recognized by an observer.

In the prior art, as a method for forming the phosphor, a method of coating photosensitive resin compositions containing phosphors of the respective colors by a printing method such as screen printing has been attempted and disclosed in Japanese Provisional Patent Publications No. 115027/1989, No. 124929/1989, No. 124930/1989 and No. 155142/1990.

However, the printing method such as screen printing is inferior in formation precision so that there are problems that it is difficult to cope with enlargement of a screen of PDP in the future, and others.

In order to solve these problems, there has been proposed a method of using a photosensitive film containing a phosphor (Japanese Provisional Patent Publication No. 273925/1994).

In the method of using a photosensitive film, a phosphor-containing photosensitive resin layer of a photosensitive film comprising a photosensitive resin layer containing a phosphor and a support film is embedded in the above PDP cell by contact bonding (lamination) under heating, the layer is subjected to imagewise exposure with active light such as UV ray by a photographic method using a negative film, an unexposed portion is removed by a developing solution such as an alkaline aqueous solution, and further unnecessary organic components are removed by calcination to form a phosphor only at a necessary portion.

In the above method of using a photosensitive resin composition containing a phosphor and a photosensitive film, it is necessary to carry out development by a developing solution such as an alkaline aqueous solution so that a copolymer obtained by copolymerizing unsaturated monomers having a carboxyl group or the like is used as a binder resin for dispersion, but a copolymer having a carboxyl group is easily reacted with a phosphor so that the photosensitive resin composition containing a phosphor and the photosensitive film have a drawback that they have poor storage stability such as thickening and gelation.

SUMMARY OF THE INVENTION

The invention according to Claim 1 is to provide a photosensitive resin composition which is not thickened for a long time and has excellent storage stability.

The invention according to Claim 2 is to provide a photosensitive film which can be used for a long time and has excellent storage stability.

The invention according to Claim 3 is to provide a process for preparing a fluorescent pattern having a good pattern shape.

The invention according to Claim 4 is to provide a process for preparing a fluorescent pattern having a good pattern shape, which has excellent operatability and environmental safety.

The invention according to Claim 5 is to provide a photosensitive resin composition which is not thickened for a long time and has excellent storage stability.

The invention according to Claim 6 is to provide a photosensitive film which can be used for a long time and has excellent storage stability.

The invention according to Claim 7 is to provide a process for preparing a fluorescent pattern having a good pattern shape.

The invention according to Claim 8 is to provide a process for preparing a fluorescent pattern having a good pattern shape, which has excellent operatability and environmental safety.

The invention according to Claim 9 is to provide a phosphor subjected to surface treatment, which is not thickened and has excellent storage stability even when the phosphor is dispersed by using a resin having a carboxyl group.

The invention according to Claim 10 is to provide a process for preparing a phosphor subjected to surface treatment, which is not thickened and has excellent storage stability even when the phosphor is dispersed by using a resin having a carboxyl group.

(1) The present invention relates to a photosensitive resin composition which comprises:
   (A) a compound having a carboxyl group;
   (B) a resin having a carboxyl group;
   (C) a photopolymerizable unsaturated compound having an ethylenic unsaturated group;
   (D) a photopolymerization initiator which produces free radical by irradiation of active light; and
   (E) a phosphor.

(2) Also, the present invention relates to a photosensitive film which comprises a layer of the above photosensitive resin composition and a support film which supports the layer.

(3) Also, the present invention relates to a process for preparing a fluorescent pattern, which comprises coating the above photosensitive resin composition on a substrate for a plasma display panel and carrying out drying, exposure in a pattern state, development and then calcination.

(4) Also, the present invention relates to a process for preparing a fluorescent pattern, which comprises laminating the above photosensitive film on a substrate for a plasma display panel, shifting a photosensitive layer of the film on the surface of the substrate for a plasma display panel and carrying out exposure in a pattern state, development and then calcination.

(5) Also, the present invention relates to a photosensitive resin composition which comprises:
(B) a resin having a carboxyl group;
(C) a photopolymerizable unsaturated compound having an ethylenic unsaturated group;
(D) a photopolymerization initiator which produces free radical by irradiation of active light; and
(F) a phosphor subjected to surface treatment with a compound having a carboxyl group.

(6) The present invention relates to a photosensitive film which comprises a layer of the above photosensitive resin composition and a support film which supports the layer.

(7) Also, the present invention relates to a process for preparing a fluorescent pattern, which comprises coating the above photosensitive resin composition on a substrate for a plasma display panel and carrying out drying, exposure in a pattern state, development and then calcination.

(8) Also, the present invention relates to a process for preparing a fluorescent pattern, which comprises laminating the above photosensitive film on a substrate for a plasma display panel, shifting a photosensitive layer of the film on the surface of the substrate for a plasma display panel and carrying out exposure in a pattern state, development and then calcination.

(9) Also, the present invention relates to a phosphor which comprises being subjected to surface treatment with a compound having a carboxyl group.

(10) Also, the present invention relates to a process for preparing a phosphor subjected to surface treatment, which comprises subjecting the surface of a phosphor with a compound having a carboxyl group.

(11) The present invention further relates to a back plate for a plasma display panel which comprises using a photosensitive resin composition as described in the above (1).

(12) The present invention further relates to a process for producing a back plate for a plasma display panel, which comprises coating the composition of the above (1) on a substrate having a barrier rib for a plasma display panel and carrying out drying, exposure in a pattern state, development and then calcination.

(13) The present invention further relates to a process for producing a back plate for a plasma display panel, which comprises coating the composition of the above (5) on a substrate having a barrier rib for a plasma display panel and carrying out drying, exposure in a pattern state, development and then calcination.

(14) The present invention further relates to a process for producing a back plate for a plasma display panel, which comprises laminating the film of the above (2) on a substrate having a barrier rib for a plasma display panel, shifting a photosensitive layer of the film on the surface of the substrate for a plasma display panel and carrying out exposure in a pattern state, development and then calcination.

(15) The present invention further relates to a process for producing a back plate for a plasma display panel, which comprises laminating the film of the above (6) on a substrate having a barrier rib for a plasma display panel, shifting a photosensitive layer of the film on the surface of the substrate for a plasma display panel and carrying out exposure in a pattern state, development and then calcination.

(16) The present invention further relates to a back plate for a plasma display panel which is produced by the process of the above (12).

(17) The present invention further relates to a back plate for a plasma display panel which is produced by the process of the above (13).

(18) The present invention further relates to a back plate for a plasma display panel which is produced by the process of the above.(14).

(19) The present invention further relates to a back plate for a plasma display panel which is produced by the process of the above (15).

DESCRIPTION OF THE PREFERRED EMBODIMENTS

Figure 1:
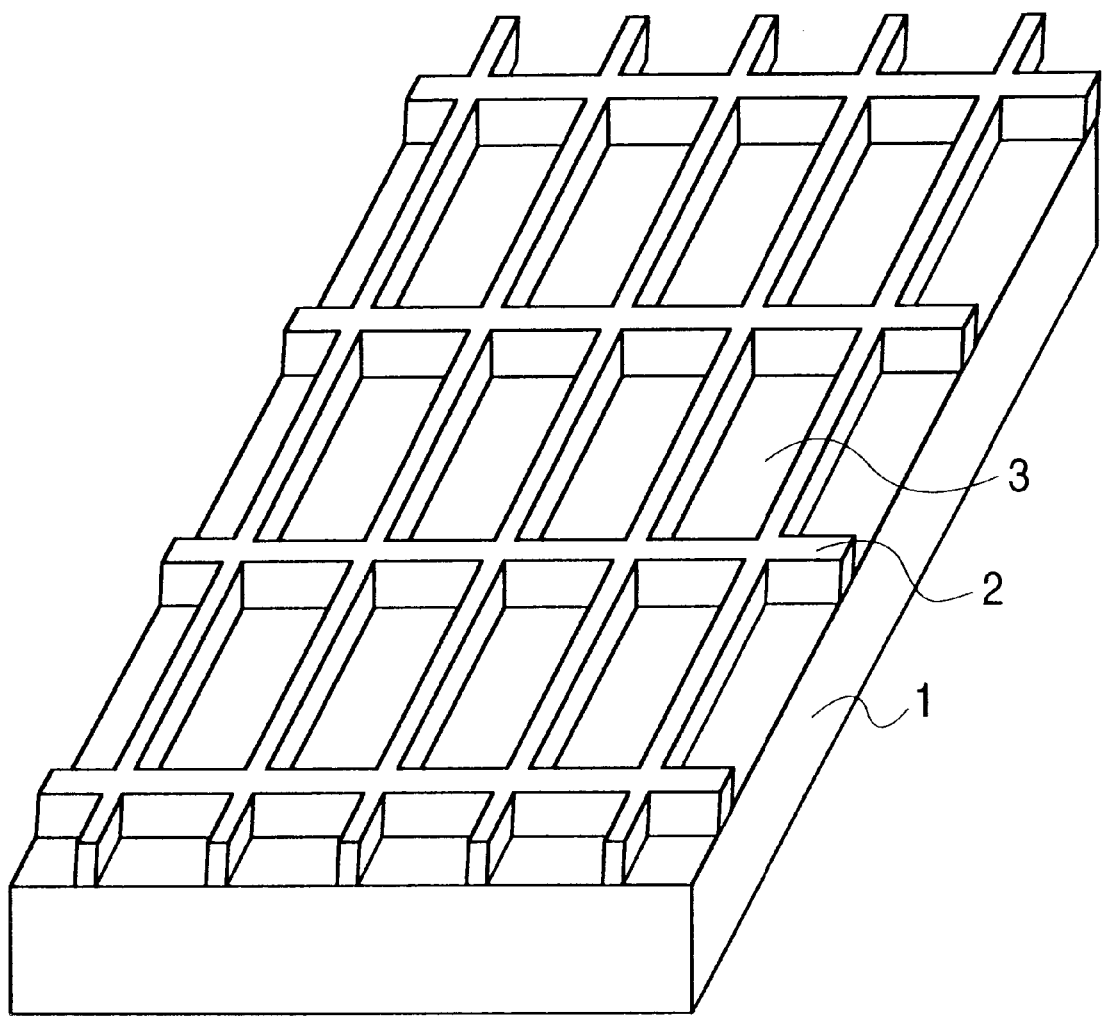
FIG. 1 is a schematical view showing one example of a barrier rib.

In the following, the present invention is explained in detail.

Firstly, the respective components forming the photosensitive resin composition in the present invention are explained.

As the compound (A) having a carboxyl group in the present invention, there may be mentioned, for example, a saturated aliphatic acid, an unsaturated aliphatic acid, an aliphatic dibasic acid, an aromatic dibasic acid, an aliphatic tribasic acid and an aromatic tribasic acid, specifically, for example, formic acid, acetic acid, chloroacetic acid, dichloroacetic acid, trichloroacetic acid, propionic acid, capric acid, undecanoic acid, lauric acid, tridecanoic acid, myristic acid, pentadecanoic acid, palmitic acid, heptadecanoic acid, stearic acid, nonadecanoic acid, arachidic acid, palmitoleic acid, oleic acid, elaidic acid, linolenic acid, linoleic acid, oxalic acid, malonic acid, methylmalonic acid, ethylmalonic acid, succinic acid, methylsuccinic acid, adipic acid, methyladipic acid, pimelic acid, suberic acid, azelaic acid, sebacic acid, maleic acid, itaconic acid, phthalic acid, isophthalic acid, terephthalic acid, trimellitic acid and citric acid.

Among them, from the point that an effect of suppressing thickening is high, oxalic acid, malonic acid, methylmalonic acid, ethylmalonic acid, succinic acid, methylsuccinic acid and citric acid are preferred, and oxalic acid, malonic acid and citric acid are more preferred. These compounds are used singly or in combination of two or more of them.

The resin (B) having a carboxyl group in the present invention can be obtained by copolymerizing an unsaturated carboxylic acid and at least one other unsaturated monomer which can be copolymerized with the unsaturated carboxylic acid.

As the unsaturated carboxylic acid, there may be mentioned, for example, acrylic acid, methacrylic acid, maleic acid, fumaric acid, itaconic acid, anhydrides thereof and half esterified compounds thereof. These acids are used singly or in combination of two or more of them.

The other unsaturated monomer which can be copolymerized with the unsaturated carboxylic acid is not particularly limited, and there may be mentioned, for example, an ester type monomer of acrylic acid or methacrylic acid (e.g., methyl acrylate, methyl methacrylate, ethyl acrylate, ethyl methacrylate, n-propyl acrylate, n-propyl methacrylate, isopropyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, pentyl acrylate, pentyl methacrylate, hexyl acrylate, hexyl methacrylate, heptyl acrylate, heptyl methacrylate, 2-ethylhexyl acrylate, 2-ethylhexyl methacrylate, octyl acrylate, octyl methacrylate, nonyl acrylate, nonyl methacrylate, decyl acrylate, decyl methacrylate, dodecyl acrylate, dodecyl methacrylate, tetradecyl acrylate, tetradecyl methacrylate, hexadecyl acrylate, hexadecyl methacrylate, octadecyl acrylate, octadecyl methacrylate, eicosyl acrylate, eicosyl methacrylate, docosyl acrylate, docosyl methacrylate, cyclopentyl acrylate, cyclopentyl methacrylate, cyclohexyl acrylate, cyclohexyl methacrylate, cycloheptyl acrylate, cycloheptyl methacrylate, benzyl acrylate, benzyl methacrylate, phenyl acrylate, phenyl methacrylate, methoxyethyl acrylate, methoxyethyl methacrylate, dimethylaminoethyl acrylate, dimethylaminoethyl methacrylate, dimethylaminopropyl acrylate, dimethylaminopropyl methacrylate, 2-chloroethyl acrylate, 2-chloroethyl methacrylate, 2-fluoroethyl acrylate, 2-fluoroethyl methacrylate, 2-cyanoethyl acrylate, 2-cyanoethyl methacrylate, diethylene glycol methoxy acrylate, diethylene glycol methoxy methacrylate, dipropylene glycol methoxy acrylate, dipropylene glycol methoxy methacrylate, triethylene glycol methoxy acrylate, triethylene glycol methoxy methacrylate, glycidyl acrylate, glycidyl methacrylate, hydroxyethyl acrylate, hydroxyethyl methacrylate, hydroxypropyl acrylate, hydroxypropyl methacrylate, 2-isocyanate-ethyl acrylate and 2-isocyanatoethyl methacrylate), a styrene type monomer (e.g., styrene, α-methylstyrene and p-t-butylstyrene), a polyolefin type monomer (e.g., butadiene, isoprene and chloroprene), a vinyl type monomer (e.g., vinyl chloride and vinyl acetate) and a nitrile type monomer (e.g., acrylonitrile and methacrylonitrile). These monomers are used singly or in combination of two or more of them.

The copolymerization amount of the unsaturated carboxylic acid in the resin (B) having a carboxyl group is preferably 1 to 95 mole %, more preferably 10 to 70 mole %, further preferably 20 to 60 mole % based on all monomers. If the copolymerization amount of the unsaturated carboxylic acid is less than 1 mole %, it tends to be difficult to obtain a resin showing sufficient developability, while if it exceeds 95 mole %, bad influence tends to be exerted on formation of a fluorescent pattern.

The copolymer of the unsaturated carboxylic acid and at least one other unsaturated monomer which can be copolymerized with the unsaturated carboxylic acid can be prepared by, for example, a known method such as a solution polymerization method, a suspension polymerization method and an emulsification polymerization method.

Among them, it is preferred to prepare the copolymer by a solution polymerization method in which polymerization is effected while a solution containing an unsaturated carboxylic acid, other monomer and a radical polymerization catalyst is added dropwise to a solution.

The reaction temperature at that time is preferably 0 to 180° C., more preferably 40 to 170° C.

The dropwise addition time at that time is preferably 1 to 10 hours, more preferably 2 to 6 hours.

An organic solvent to be used for copolymerization is not particularly limited so long as it dissolves a copolymer produced during the copolymerization reaction, and there may be mentioned, for example, an alcohol type solvent (e.g., methanol, ethanol, propanol, isopropanol, butanol, isobutanol and benzyl alcohol), a polyalkylene glycol type solvent (e.g., ethylene glycol monomethyl ether, diethylene glycol monomethyl ether, triethylene glycol monomethyl ether, tetraethylene glycol monomethyl ether, ethylene glycol monoethyl ether, diethylene glycol monoethyl ether, triethylene glycol monoethyl ether, tetraethylene glycol monoethyl ether, ethylene glycol monobutyl ether, diethylene glycol monobutyl ether, triethylene glycol monobutyl ether, tetraethylene glycol monobutyl ether, ethylene glycol dimethyl ether, diethylene glycol dimethyl ether, triethylene glycol dimethyl ether, tetraethylene glycol dimethyl ether, ethylene glycol diethyl ether, diethylene glycol diethyl ether, triethylene glycol diethyl ether, tetraethylene glycol diethyl ether, ethylene glycol dibutyl ether, diethylene glycol dibutyl ether, triethylene glycol dibutyl ether, tetraethylene glycol dibutyl ether, ethylene glycol monoacetate, diethylene glycol monoacetate, triethylene glycol monoacetate, tetraethylene glycol monoacetate, ethylene glycol diacetate, diethylene glycol diacetate, triethylene glycol diacetate, tetraethylene glycol diacetate, ethylene glycol monomethyl ether acetate, diethylene glycol monomethyl ether acetate, triethylene glycol monomethyl ether acetate, tetraethylene glycol monomethyl ether acetate, ethylene glycol monoethyl ether acetate, diethylene glycol monoethyl ether acetate, triethylene glycol monoethyl ether acetate, tetraethylene glycol monoethyl ether acetate, ethylene glycol monobutyl ether acetate, diethylene glycol monobutyl ether acetate, triethylene glycol monobutyl ether acetate and tetraethylene glycol monobutyl ether acetate), an aromatic hydrocarbon type solvent (e.g., toluene and xylene), an ester type solvent (e.g., ethyl acetate and butyl acetate), a ketone type solvent (e.g., acetone, methyl ethyl ketone, methyl isobutyl ketone and cyclohexanone), a halogenated solvent (e.g., mnethylene chloride, chloroform, carbon tetrachloride and trichloroethane) and other solvent (e.g., tetramethylsulfone, N-methylpyrrolidone, N,N-dimethylformamide and γ-butyrolactone). Water which has no problem in environmental pollution can be also considered as a solvent. These solvents are used singly or in combination of two or more of them.

The amount of the organic solvent to be used is not particularly limited, and it is generally 0.5 to 4 times (weight ratio) based on all the unsaturated monomers.

As the radical polymerization catalyst to be used for copolymerization, there may be mentioned initiators such as an azo type compound and a peroxide type compound, which can be used for common radical polymerization.

There may be mentioned specifically 2,2'-azobis(4-methoxy-2,4-dimethylvaleronitrile), 2,2'-azobis(cyclopropylpropionitrile), 2,2'-azobis(2,4-dimethylvaleronitrile), 2,2'-azobis(isobutyronitrile), 2,2'-azobis(2-methylbutyronitrile), 1,1'-azobis(cyclohexane-1-carbonitrile), 2-phenylazo-4-methoxy-2,4-dimethylvaleronitrile, benzoyl peroxide and di-tert-butyl peroxybenzoate. These catalysts are used singly or in combination of two or more of them.

The amount of the radical polymerization catalyst to be used is not particularly limited, and it is preferably 0.1 to 5% by weight, more preferably 0.2 to 4% by weight based on the total monomer amount.

The acid value of the copolymer obtained is preferably 5 to 400, more preferably 10 to 300, particularly preferably 15 to 200. If the acid value is less than 5, developability tends to be lowered, while if it exceeds 400, bad influence tends to be exerted on the shape of a fluorescent pattern.

The weight average molecular weight of the copolymer obtained is not particularly limited, and from the points of film-forming property, film strength and developability, it is preferably 5,000 to 300,000, more preferably 10,000 to 150,000. In the present invention, the weight average molecular weight is a value obtained by carrying out measurement by a gel permeation chromatography method and converted by using a standard polystyrene calibration curve.

For the purpose of adjusting the molecular weight, a suitable chain transfer agent may be formulated at the time of copolymerization.

As the chain transfer agent, there may be mentioned, for example, methanethiol, ethanethiol, n-propanethiol, isopropanethiol, n-butanethiol, 2-methylpropanethiol, 3-methylpropanethiol, 1,1-dimethylethanethiol, 1-hexanethiol, 1-octanethiol, 1-decanethiol, benzenethiol, 2-methylbenzenethiol, 3-methylbenzenethiol, 4-methylbenzenethiol, 2-ethylbenzenethiol, 3-ethylbenzenethiol, 4-ethylbenzenethiol, bis(4-hydroxydimethylphenyl)disulfide, bis(2-chloromethylphenyl)disulfide, bis(2-bromomethylphenyl) disulfide, dinaphthyl disulfide, di-2-benzothiadisulfide, an α-methylstyrene dimer, carbon tetrachloride, carbon tetrabromide and chloroform.

The amount of the chain transfer agent to be formulated may be suitably selected depending on the molecular weight of the desired copolymer.

As the resin (B) having a carboxyl group, a commercially available product can be also used.

Further, in order to improve the sensitivity of the photosensitive resin composition, an unsaturated bond may be also introduced into the molecule of the resin (B) having a carboxyl group by adding a compound having at least one ethylenic unsaturated group and one functional group such as an oxirane ring, an isocyanate group, a hydroxy group, a carboxyl group, an amino group and an acid anhydride group, to a reactive functional group in the molecule of the resin (B) having a carboxyl group. As the reactive functional group in the molecule of the resin (B) having a carboxyl group, there may be mentioned a functional group such as a carboxyl group, a hydroxy group, an amino group, an isocyanate group, an oxirane ring and an acid anhydride group. As the compound having at least one ethylenic unsaturated group and one functional group such as an oxirane ring, an isocyanate group, a hydroxy group, a carboxyl group, an amino group and an acid anhydride group, there may be mentioned, for example, glycidyl acrylate, glycidyl methacrylate, isocyanate-ethyl methacrylate, 2-hydroxyethyl acrylate, 2-hydroxyethyl methacrylate, acrylic acid, methacrylic acid, maleic acid, fumaric acid, itaconic acid, cinnamic acid, acrylamide, methacrylamide and maleic anhydride. These compounds may be used singly or in combination of two or more of them.

As the photopolymerizable unsaturated compound (C) having an ethylenic unsaturated group in the present invention, there may be used all compounds which have been conventionally known as a photopolymerizable monofunctional monomer or a photopolymerizable polyfunctional monomer.

For example, there may be mentioned a compound represented by the following formula (I):

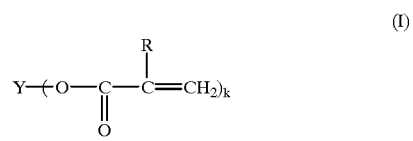

wherein R represents a hydrogen atom or a methyl group, k represents an integer of 1 to 10, and Y represents a saturated or unsaturated hydrocarbon residue or heterocyclic residue which may have a substituent(s), or a polyalkylene glycol residue

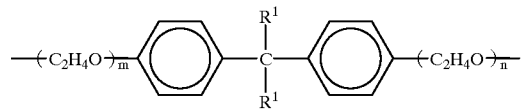

wherein $R^1$ represents a hydrogen atom, a methyl group, an ethyl group, a propyl group or a trifluoromethyl group, and m and n each independently represent an integer of 1 to 20.

In the formula (I), as the saturated or unsaturated hydrocarbon residue or heterocyclic residue which may have a substituent(s) represented by Y, there may be mentioned, for example, a straight, branched or alicyclic alkane residue having 1 to 22 carbon atoms, which may have a substituent (s) such as a halogen atom, a hydroxyl group, an amino group and a carboxyl group (e.g., a methane residue, an ethane residue, a propane residue, a cyclopropane residue, a butane residue, an isobutane residue, a cyclobutane residue, a pentane residue, an isopentane residue, a neopentane residue, a cyclopentane residue, a hexane residue, a cyclohexane residue, a haptane residue, a cycloheptane residue, an octane residue, a nonane residue and a decane residue), an aromatic cyclic residue (e.g., a benzene residue, a naphthalene residue, an anthracene residue, a biphenyl residue and a terphenyl residue) and a heterocyclic residue (e.g., a furan residue, a thiophene residue, a pyrrole residue, an oxazole residue, a thiazole residue, an imidazole residue, a pyridine residue, a pyrimidine residue, a pyrazine residue, a triazine residue, a quinoline residue and a quinoxaline residue).

Specifically, as a monomer having one unsaturated bond, there may be mentioned, for example, an ester type monomer of acrylic acid or methacrylic acid (e.g., methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, pentyl acrylate, pentyl methacrylate, hexyl acrylate, hexyl methacrylate, heptyl acrylate, heptyl methacrylate, 2-ethylhexyl acrylate, 2-ethylhexyl methacrylate, octyl acrylate, octyl methacrylate, nonyl acrylate, nonyl methacrylate, decyl acrylate, decyl methacrylate, dodecyl acrylate, dodecyl methacrylate, tetradecyl acrylate, tetradecyl methacrylate, hexadecyl acrylate, hexadecyl methacrylate, octadecyl acrylate, octadecyl methacrylate, eicosyl acrylate, eicosyl methacrylate, docosyl acrylate, docosyl methacrylate, cyclopentyl acrylate, cyclopentyl methacrylate, cyclohexyl acrylate, cyclohexyl methacrylate, cycloheptyl acrylate, cycloheptyl methacrylate, benzyl acrylate, benzyl methacrylate, phenyl acrylate, phenyl methacrylate, methoxyethyl acrylate, methoxyethyl methacrylate, dimethylaminoethyl acrylate, dimethylaminoethyl methacrylate, dimethylaminopropyl acrylate, dimethylaminopropyl methacrylate, 2-chloroethyl acrylate, 2-chloroethyl methacrylate, 2-fluoroethyl acrylate, 2-fluoroethyl methacrylate, 2-cyanoethyl acrylate, 2-cyanoethyl methacrylate, diethylene glycol methoxy acrylate, diethylene glycol methoxy methacrylate, dipropylene glycol methoxy acrylate, dipropylene glycol methoxy methacrylate, triethylene glycol methoxy acrylate and triethylene glycol methoxy methacrylate), a styrene type monomer (e.g., styrene, α-methylstyrene and p-t-butylstyrene), a polyolefin type monomer (e.g., butadiene, isoprene and chloroprene), a vinyl type monomer (e.g., vinyl chloride and vinyl acetate), a nitrile type monomer (e.g., acrylonitrile and methacrylonitrile) and 1-(methacryloyloxyethoxycarbonyl)-2-(3'-chloro-2'-hydroxypropoxycarbonyl)benzene.

As a monomer having two unsaturated bonds, there may be mentioned, for example, ethylene glycol diacrylate, ethylene glycol dimethacrylate, diethylene glycol diacrylate, diethylene glycol dimethacrylate, triethylene glycol diacrylate, triethylene glycol dimethacrylate, tetraethylene glycol diacrylate, tetraethylene glycol dimethacrylate, polyethylene glycol diacrylate, polyethylene glycol dimethacrylate, hexapropylene glycol diacrylate, hexapropylene glycol dimethacrylate, polypropylene glycol diacrylate, polypropylene glycol dimethacrylate, butylene glycol diacrylate, butylene glycol dimethacrylate, neopentyl glycol diacrylate, neopentyl glycol dimethacrylate, 1,3-butanediol diacrylate, 1,3-butanediol dimethacrylate, 1,4-butanediol diacrylate, 1,4-butanediol dimethacrylate, 1,5-pentanediol diacrylate, 1,5-pentanediol dimethacrylate, 1,6-hexanediol diacrylate, 1,6-hexanediol dimethacrylate, pentaerythritol diacrylate, pentaerythritol dimethacrylate, trimethylolpropane diacrylate, trimethylolpropane dimethacrylate, bisphenol A diacrylate, bisphenol A dimethacrylate, 2,2-bis(4-acryloxyethoxyphenyl)propane, 2,2-bis(4-methacryloxyethoxyphenyl)propane, 2,2-bis(4-acryloxydiethoxyphenyl)propane, 2,2-bis(4-methacryloxydiethoxyphenyl)propane, 2,2-bis(4-acryloxypolyethoxyphenyl)propane, 2,2-bis(4-methacryloxypolyethoxyphenyl)propane (in the formula (I), Y is

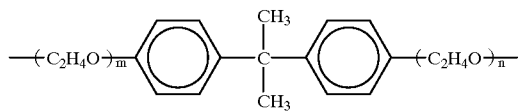

wherein m and n each independently represent an integer of 1 to 20), bisphenol A diglycidyl ether diacrylate, bisphenol A diglycidyl ether dimethacrylate and a urethane diacrylate compound.

As the monomer having three unsaturated bonds, there may be mentioned, for example, trimethylolpropane triacrylate, trimethylolpropane trimethacrylate, pentaerythritol triacrylate, pentaerythritol trimethacrylate, ethylene oxide-modified trimethylolpropane triacrylate, ethylene oxide-modified trimethylolpropane trimethacrylate, trimethylolpropane triglycidyl ether triacrylate and trimethylolpropane triglycidyl ether trimethacrylate.

As the monomer having four unsaturated bonds, there may be mentioned, for example, tetramethylolpropane tetraacrylate, tetramethylolpropane tetramethacrylate, pentaerythritol tetraacrylate and pentaerythritol tetramethacrylate.

As the monomer having five unsaturated bonds, there may be mentioned, for example, dipentaerythritol pentaacrylate and dipentaerythritol pentamethacrylate.

As the monomer having six unsaturated bonds, there may be mentioned, for example, dipentaerythritol hexaacrylate and dipentaerythritol hexamethacrylate.

Any of these monomers having an unsaturated bond(s) may be used so long as radical polymerization is effected by irradiation of light, and these monomers having an unsaturated bond(s) are used singly or in combination of two or more of them.

The photopolymerization initiator (D) which produces free radical by irradiation of active light in the present invention is not particularly limited, and there may be mentioned, for example, an aromatic ketone (e.g., benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1,2-ethylanthraquinone and phenanthrenequinone), a benzoin ether (e.g., benzoin methyl ether, benzoin ethyl ether and benzoin phenyl ether), a benzoin (e.g., methyl benzoin and ethyl benzoin), a benzyl derivative (e.g., benzyldimethylketal), a 2,4,5-triarylimidazole dimer (e.g., a 2-(o-chlorophenyl)-4,5-diphenylimidazole dimer, a 2-(o-chlorophenyl)-4,5-di(m-methoxyphenyl)imidazole dimer, a 2-(o-fluorophenyl)-4,5-phenylimidazole dimer, a 2-(o-methoxyphenyl)-4,5-diphenylimidazole dimer, a 2-(p-methoxyphenyl)-4,5-diphenylimidazole dimer, a 2,4-di(p-methoxyphenyl)-5-phenylimidazole dimer and a 2-(2,4-dimethoxyphenyl)-4,5-diphenylimidazole dimer) and an acridine derivative (e.g., 9-phenylacridine and 1,7-bis(9,9'-acridinyl)heptane). These photopolymerization initiators are used singly or in combination of two or more of them.

The phosphor (E) in the present invention is not particularly limited, and a phosphor comprising a common metal oxide as a main component is used.

As a phosphor which emits red light, there may be mentioned, for example, $Y_2O_2S:Eu$, $Zn_3(PO_4)_2:Mn$, $Y_2O_3:Eu$, $YVO_4:Eu$ and $(Y,Gd)BO_3:Eu$.

As a phosphor which emits blue light, there may be mentioned, for example, $ZnS:Ag$, $ZnS:Ag,Al$, $ZnS:Ag,Ga$, $Al$, $ZnS:Ag,Cu,Ga,Cl$, $ZnS:Ag+In_2O_3$, $Ca_2B_5O_9Cl:Eu^{2+}$, $(Sr,Ca,Ba,Mg)_{10}(PO_4)_6Cl_2:Eu^{2+}$, $Sr_{10}(PO_4)_6Cl_2:Eu^{2+}$, $BaMgAl_{14}O_{23}:Eu^{2+}$ and $BaMgAl_{16}O_{26}:Eu^{2+}$.

As a phosphor which emits green light, there may be mentioned, for example, $ZnS:Cu$, $Zn_2SiO_4:Mn$, $ZnS:Cu+Zn_2SiO_4:Mn$, $Gd_2O_2S:Tb$, $Y_3Al_5O_{12}:Ce$, $ZnS:Cu,Al$, $Y_2O_2S:Tb$, $ZnO:Zn$, $Zn_2GeO_4Mn$, $ZnS:Cu,Al+In_2O_3$, $LaPO_4:Ce,Tb$ and $BaO.6Al_2O_3:Mn$.

The above phosphors are commercially available from Kasei Optonics Co. and Nichia Kagaku Kogyo Co., both Japan.

The phosphor (F) subjected to surface treatment with a compound having a carboxyl group in the present invention is obtained by subjecting the phosphor (E) described above to surface treatment with the compound (A) having a carboxyl group described above.

As the surface treatment method in the present invention, there may be mentioned, for example, a method in which the compound having a carboxyl group as such or dissolved in a solvent is added to the phosphor as such or in a state that it is dispersed in a solvent, the mixture is stirred sufficiently and then the solvent is evaporated to dryness, or filtered and dried.

The amount of the compound (A) having a carboxyl group to be used for the surface treatment in the present invention is not particularly limited, and it is preferably 0.01 to 100 parts by weight, more preferably 0.1 to 10 parts by weight, further preferably 0.2 to 5 parts by weight based on 100 parts by weight of the phosphor (E). If the amount to be added is less than 0.01 part by weight, an effect of suppressing thickening of a photosensitive resin tends to be insufficient, while if it exceeds 100 parts by weight, a residue tends to remain at the time of calcination to reduce the light emission efficiency of the phosphor.

When a solvent is used for the surface treatment, the solvent to be used is not particularly limited so long as it dissolves the compound (A) having a carboxyl group uniformly and does not dissolve the phosphor (E), and there may be mentioned, for example, an alcohol type solvent (e.g., ethanol, propanol, isopropanol, butanol, isobutanol and benzyl alcohol), a polyalkylene glycol type solvent (e.g., ethylene glycol dimethyl ether, diethylene glycol dimethyl ether, triethylene glycol dimethyl ether, ethylene glycol diethyl ether, diethylene glycol diethyl ether, triethylene glycol diethyl ether, ethylene glycol monoacetate, diethylene glycol monomethyl ether, diethylene glycol monomethyl ether acetate, diethylene glycol monoethyl ether, diethylene glycol monoethyl ether acetate, diethylene glycol monobutyl ether and diethylene glycol monobutyl ether acetate), an aromatic hydrocarbon type solvent (e.g., toluene and xylene), an ester type solvent (e.g., ethyl acetate and butyl acetate), a ketone type solvent (e.g., acetone, methyl ethyl ketone, cyclohexanone and methyl isobutyl ketone) and a halogenated solvent (e.g., carbon tetrachloride and trichloroethane). Water which has no problem in environmental pollution may be also mentioned as a solvent. These solvents are used singly or in combination of two or more of them.

The amount of the solvent to be used is not particularly limited, and it is preferably 10 to 10,000 parts by weight based on 100 parts by weight of the phosphor.

For the purpose of dissolving the compound having a carboxyl group, the surface treatment may be also carried out while heating.

Next, the formulation ratio of the respective components is explained.

The amount of Component (A) to be formulated in the present invention is preferably 0.01 to 30 parts by weight, more preferably 0.1 to 10 parts by weight, further preferably 0.2 to 5 parts by weight based on 100 parts by weight of Component (B). If the amount to be formulated is less than 0.01 part by weight, an effect of storage stability tends to be lowered, while if it exceeds 30 parts by weight, sensitivity tends to be insufficient.

The amount of Component (B) to be formulated in the present invention is preferably 10 to 90 parts by weight, more preferably 20 to 80 parts by weight, further preferably 40 to 70 parts by weight based on the total amount of Component (B), Component (C) and Component (D) being 100 parts by weight. If the amount to be formulated is less than 10 parts by weight, a photocured product tends to be brittle, while if it exceeds 90 parts by weight, sensitivity tends to be insufficient.

The amount of Component (C) to be formulated in the present invention is preferably 10 to 70 parts by weight, more preferably 15 to 60 parts by weight, further preferably 20 to 50 parts by weight based on the total amount of Component (B), Component (C) and Component (D) being 100 parts by weight. If the amount to be formulated is less than 10 parts by weight, sensitivity tends to be insufficient, while if it exceeds 70 parts by weight, a photocured product tends to be brittle.

The amount of Component (D) to be formulated in the present invention is preferably 0.01 to 40 parts by weight, more preferably 0.1 to 20 parts by weight, further preferably 0.2 to 10 parts by weight based on the total amount of Component (B), Component (C) and Component (D) being 100 parts by weight. If the amount to be formulated is less than 0.01 part by weight, sensitivity tends to be insufficient, while if it exceeds 40 parts by weight, absorption at the surface of a composition tends to be increased during exposure to make photocuring at an inner portion insufficient.

The amount of Component (E) or (F) to be formulated in the present invention is preferably 20 to 500 parts by weight, more preferably 50 to 400 parts by weight, further preferably 100 to 350 parts by weight based on the total amount of Component,(B), Component (C) and Component (D) being 100 parts by weight. If the amount to be formulated is less than 20 parts by weight, it tends to be difficult to form a uniform fluorescent pattern, while if it exceeds 500 parts by weight, operatability such as coating property tends to be lowered.

The photosensitive resin composition of the present invention can be made a solution in which the above respective components are uniformly dispersed, by dissolving them in a solvent in which they can be dissolved or dispersed and mixing the resulting solution.

As the solvent, there may be mentioned, for example, an alcohol type solvent (e.g., methanol, ethanol, propanol, isopropanol, butanol, isobutanol and benzyl alcohol), a polyalkylene glycol type solvent (e.g., ethylene glycol monomethyl ether, diethylene glycol monomethyl ether, triethylene glycol monomethyl ether, tetraethylene glycol monomethyl ether, ethylene glycol monoethyl ether, diethylene glycol monoethyl ether, triethylene glycol monoethyl ether, tetraethylene glycol monoethyl ether, ethylene glycol monobutyl ether, diethylene glycol monobutyl ether, triethylene glycol monobutyl ether, tetraethylene glycol monobutyl ether, ethylene glycol dimethyl ether, diethylene glycol dimethyl ether, triethylene glycol dimethyl ether, tetraethylene glycol dimethyl ether, ethylene glycol diethyl ether, diethylene glycol diethyl ether, triethylene glycol diethyl ether, tetraethylene glycol diethyl ether, ethylene glycol dibutyl ether, diethylene glycol dibutyl ether, triethylene glycol dibutyl ether, tetraethylene glycol dibutyl ether, ethylene glycol monoacetate, diethylene glycol monoacetate, triethylene glycol monoacetate, tetraethylene glycol monoacetate, ethylene glycol diacetate, diethylene glycol diacetate, triethylene glycol diacetate, tetraethylene glycol diacetate, ethylene glycol monomethyl ether acetate, diethylene glycol monomethyl ether acetate, triethylene glycol monomethyl ether acetate, tetraethylene glycol monomethyl ether acetate, ethylene glycol monoethyl ether acetate, diethylene glycol monoethyl ether acetate, triethylene glycol monoethyl ether acetate, tetraethylene glycol monoethyl ether acetate, ethylene glycol monobutyl ether acetate, diethylene glycol monobutyl ether acetate, triethylene glycol monobutyl ether acetate and tetraethylene glycol monobutyl ether acetate), an aromatic hydrocarbon type solvent (e.g., toluene and xylene), an ester type solvent (e.g., ethyl acetate and butyl acetate), a ketone type solvent (e.g., acetone, methyl ethyl ketone, methyl isobutyl ketone and cyclohexanone), a halogenated solvent (e.g., methylene chloride, chloroform, carbon tetrachloride and trichloroethane) and other solvent (e.g., tetramethylsulfone, N-methylpyrrolidone, N,N-dimethylformamide and γ-butyrolactone). Water which has no problem in environmental pollution can be also considered as a solvent. These solvents are used singly or in combination of two or more of them.

The amount of the solvent to be formulated is preferably 10 to 500 parts by weight, more preferably 15 to 300 parts by weight, further preferably 50 to 300 parts by weight based on the total amount of Component (B), Component (C) and Component (D) being 100 parts by weight. If the amount to be formulated is less than 10 parts by weight, it tends to be difficult to form a uniform film of the photosensitive resin composition, while if it exceeds 500 parts by weight, a photosensitive resin composition film tends to be too thin.

In order to obtain good dispersion of the phosphor, it is preferred to add a dispersant to the photosensitive resin composition of the present invention.

As the dispersant, there may be mentioned an inorganic dispersant (e.g., silica gel type, bentonite type, kaolinite type, talc type, hectorite type, montmorillonite type, saponite type and beidellite type) and an organic dispersant (e.g., aliphatic acid amide type, aliphatic acid ester type, polyethylene oxide type, a sulfate type anion surfactant, polycarboxylic acid amine salt type, polycarboxylic acid type, polyamide type, high molecular weight polyether type, acryl copolymer type and special silicone type). These dispersants are used singly or in combination of two or more of them.

The amount of the dispersant to be used is not particularly limited, and it is preferably 0.01 to 100% by weight based on the resinous solid (non-volatile) component of the polymer. If the amount to be used is less than 0.01% by weight, an effect to be brought about by addition tends not to appear, while if it exceeds 100% by weight, precision of pattern formation tends to be inferior.

In the photosensitive resin composition of the present invention, it is preferred to use a binder for the purpose of preventing peeling of the phosphor from a substrate after calcination.

As the binder, there may be mentioned, for example, a low melting point glass, a metal alkoxide and a silane coupling agent.

The amount of the binder to be used is not particularly limited, and it is preferably 0.01 to 100 parts by weight, more preferably 0.1 to 50 parts by weight, particularly preferably 0.1 to 30 parts by weight based on 100 parts by weight of Component (E) or (F). If the amount to be used is less than 0.01 part by weight, an effect to be brought about by addition tends not to appear, while if it exceeds 100 parts by weight, light emission efficiency tends to be inferior.

If necessary, additives such as a thermosetting agent, a coloring dye, a light-emitting dye, a plasticizer, an antioxidant, a polymerization inhibitor, a surface-modifying agent, an adhesiveness-imparting agent, a stabilizer, a defoaming agent and a flame retardant may be added suitably to the photosensitive resin composition of the present invention.

The photosensitive film of the present invention has a layer of the above photosensitive resin composition of the present invention and a support film which supports the layer.

The viscosity at 100° C. of the photosensitive resin composition to be used for the photosensitive film of the present invention is made preferably 1 to $1 \times 10^9$ Pa.sec, more preferably 2 to $1 \times 10^8$ Pa.sec, particularly preferably 5 to $1 \times 10^7$ Pa.sec, extremely preferably 10 to $1 \times 10^6$ Pa.sec by adjusting the weight average molecular weight and glass transition temperature of the resin (B) having a carboxyl group and the formulation ratio of the resin (B) having a carboxyl group to the photopolymerizable unsaturated compound (C) having an ethylenic unsaturated group.

If the viscosity at 100° C. is less than 1 Pa.sec, viscosity at room temperature tends to be too small to lower stability, while if it exceeds $1 \times 10^9$ Pa.sec, conformity tends to be inferior.

As the support film in the present invention, there may be mentioned, for example, a film of a polymer such as polyethylene terephthalate, polypropylene and polyethylene, and among them, polyethylene terephthalate is preferred.

It is required that the above polymer films can be removed later from a photosensitive resin composition layer so that they should not be films subjected to surface treatment or comprising a material which makes peeling impossible.

The thickness of the polymer films is generally preferably 5 to 100 $\mu$m, more preferably 10 to 80 $\mu$m.

One of the polymer films may be used as the support film of the photosensitive resin composition layer, and the other may be laminated on both surfaces of the photosensitive resin composition layer as a protective film of the photosensitive resin composition layer.

The photosensitive film of the present invention can be obtained by coating the photosensitive resin composition of the present invention on the support film by a knife coating method, a roll coating method, a spray coating method or the like, drying the composition and then, if necessary, laminating a peelable protective film.

The thickness of the photosensitive resin composition layer of the photosensitive film thus obtained is generally preferably 10 to 100 $\mu$m. If the thickness of the photosensitive resin composition layer is less than 10 $\mu$m, a phosphor layer tends to be too thin, while if it exceeds 100 $\mu$m, time tends to be required for drying at the time of preparing the photosensitive film to increase production cost. The photosensitive resin composition layer having a thickness of 100 $\mu$m or more can be obtained by repeating lamination of the photosensitive film.

For the purpose of maintaining characteristics, it is preferred that the amount of the solvent remaining in the photosensitive resin composition layer is controlled to 2% by weight or less.

The process for preparing a fluorescent pattern of the present invention comprises coating the photosensitive resin composition of the present invention on a substrate for a plasma display panel and carrying out drying, exposure in a pattern state, development and then calcination.

The viscosity at ordinary temperature of the photosensitive resin composition to be used for the process for preparing a fluorescent pattern of the present invention is made preferably 1 to 500 Pa.sec, more preferably 10 to 200 Pa.sec by adjusting the weight average molecular weight and glass transition temperature of the resin (B) having a carboxyl group and the formulation ratio of the resin (B) having a carboxyl group to the photopolymerizable unsaturated compound (C) having an ethylenic unsaturated group.

If the viscosity at ordinary temperature is less than 1 Pa.sec, it tends to be impossible to obtain a desired film thickness, while if it exceeds 500 Pa.sec, uniform coating tends to be difficult to make conformity inferior.

As the substrate for a plasma display panel in the present invention, there may be mentioned, for example, a substrate such as a glass plate and a synthetic resin plate, which may be subjected to surface treatment for transparent adhesion and on which an electrode and a barrier rib are formed.

On the substrate for a plasma display panel, in addition to an electrode and a barrier rib, a dielectric film, an insulating film, an auxiliary electrode and a resistor may be formed, if necessary.

A method of forming the above members on the substrate is not particularly limited. For example, an electrode can be formed on the substrate by a method such as vapor deposition, sputtering, plating, coating and printing, and a barrier rib can be formed by a method such as a printing method, a sand blasting method and an embedding method.

The barrier rib generally has a height of 20 to 500 μm and a width of 20 to 200 μm.

The shape of a discharge space surrounded with the barrier rib is not particularly limited and may be lattice-shaped, striped, honeycomb-shaped, triangular or elliptical. In general, a lattice-shaped or striped discharge space as shown in FIG. 1 and FIG. 2 is formed.

Figure 2:
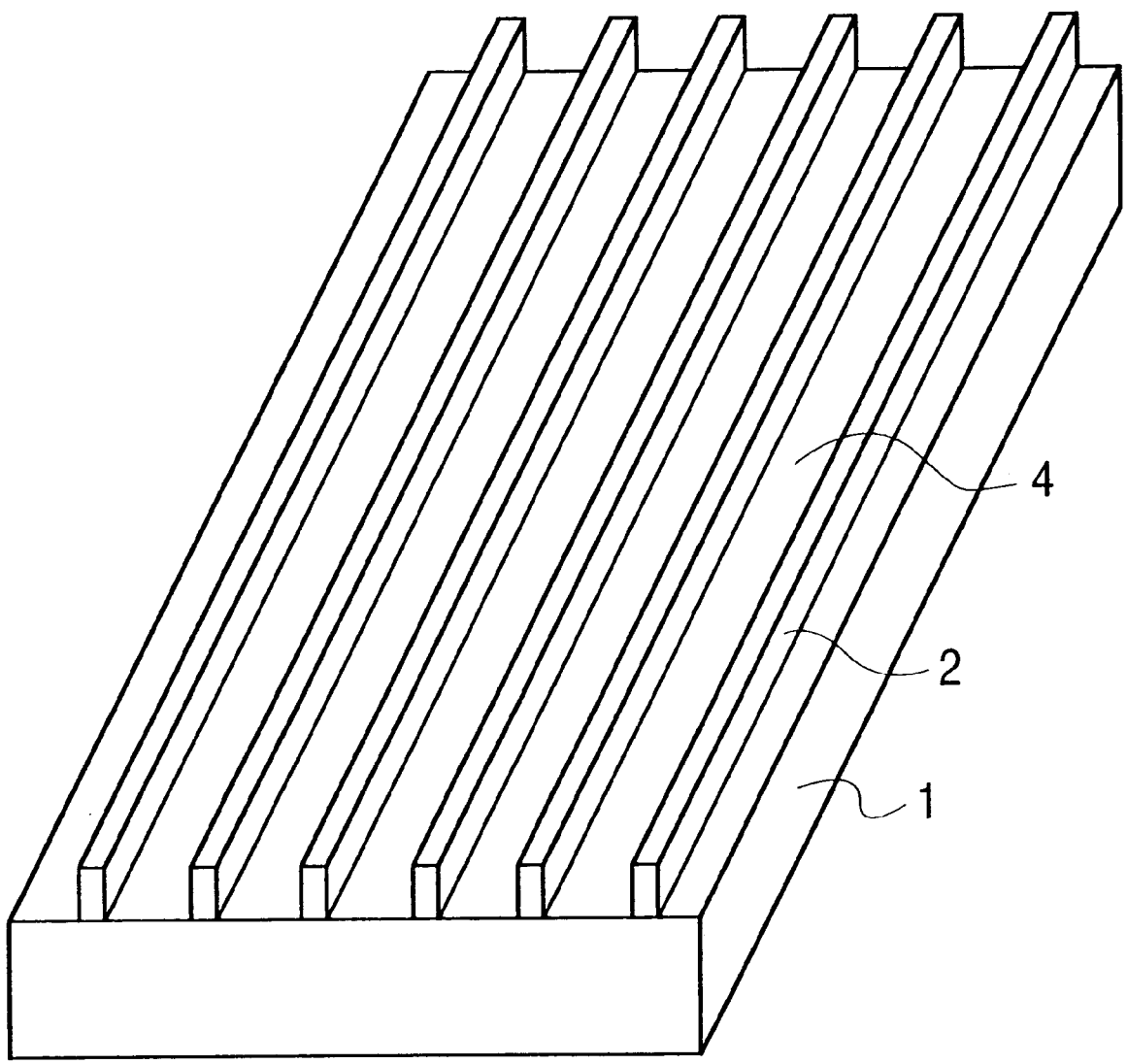
FIG. 2 is a schematical view showing one example of a barrier rib.

In FIG. 1 and FIG. 2, 1 is a substrate, 2 is a barrier rib, 3 is a lattice-shaped discharge space, and 4 is a striped discharge space.

The size of the discharge space is determined by the size and resolution of PDP. In general, in the lattice-shaped discharge space as shown in FIG. 1, the longitudinal and lateral lengths are 50 μm to 1 mm, and in the striped discharge space as shown in FIG. 2, the interval is 30 μm to 1 mm.

As a coating method, there may be used, for example, a doctor blade coating method, a Meyer bar coating method, a roll coating method, a screen coating method, a spinner coating method, an ink jet coating method, a spray coating method and a dip coating method.

Drying can be carried out by using a known drying method. The drying temperature is preferably 40 to 100° C., and the drying time is preferably 10 to 90 minutes.

The film thickness after drying of the photosensitive resin composition layer of the present invention coated on the substrate for a plasma display panel as described above is preferably 10 to 100 μm. If the thickness of the photosensitive resin composition layer is less than 10 μm, the phosphor layer tends to be too thin, while if it exceeds 100 μm, operatability tends to be inferior.

As a method of carrying out exposure in a pattern state and development, there may be mentioned, for example, a method in which a pattern mask which is contacted or not contacted with a cured resin layer is subjected to exposure with active light at certain intervals and then development is carried out by using a developing solution to remove an unexposed portion, whereby a pattern is formed. Also, after exposure, curing can be carried out by heating, if necessary.

As the active light, there may be preferably used light generated from a known active light source, for example, carbon arc, mercury vapor arc, xenon arc and others.

The sensitivity of the photopolymerization initiator contained in the photosensitive resin composition layer is generally the largest in a UV ray region so that in that case, an active light source which radiates UV ray effectively should be used. As a matter of course, when the photopolymerization initiator is sensitive to visible rays, for example, it is 9,10-phenanthrenequinone, visible light can be used as the active light, and as a light source thereof, there may be also used, in addition to the above light sources, a flood bulb for photographs and a solar lamp.

The exposure dose of the active light is not particularly limited, and it is preferably 3 mJ to 3,000 mJ, more preferably 5 mJ to 2,000 mJ, particularly preferably 10 mJ to 1,000 mJ.

The exposure sensitivity of the photosensitive resin composition layer of the present invention measured by using Kodak step tablet No. 2 (trade name, produced by Eastman Kodak Co., a step tablet of 21 grades) is preferably in the range of 1 to 21 grades, more preferably in the range of 1.5 to 18 grades, particularly preferably in the range of 2 to 15 grades.

With respect to the resolution of the photosensitive resin composition layer of the present invention measured by using a negative mask for testing (produced by Hitachi Chemical Co., Ltd.), line/space (μm) is preferably 1,000/1,000 or less, more preferably 900/900 or less, particularly preferably 800/800 or less.

With respect to the adhesiveness of the photosensitive resin composition layer of the present invention measured by using a negative mask for testing (produced by Hitachi Chemical Co., Ltd.), line/space (μm) is preferably 400/400 or less, more preferably 350/400 or less, particularly preferably 300/400 or less.

As a developing method, there may be used a known method such as spraying, dipping by rocking, blushing and scrapping.

As the developing solution, there may be used a known developing solution such as an alkaline aqueous solution, an aqueous developing solution and, depending on the case, an organic solvent.

As a base of the alkaline aqueous solution, there may be mentioned an alkali hydroxide (e.g., a hydroxide of lithium, sodium or potassium), an alkali carbonate (e.g., a carbonate or bicarbonate of lithium, sodium or potassium), an alkali metal phosphate (e.g., potassium phosphate and sodium phosphate), an alkali metal pyrophosphate (e.g., sodium pyrophosphate and potassium pyrophosphate), tetramethylammonium hydroxide and triethanolamine, and among them, an aqueous solution containing sodium carbonate or tetramethylammonium hydroxide is preferred.

The pH of the alkaline aqueous solution to be used for development is preferably 9 to 11. The temperature can be adjusted depending on the developability of the photosensitive layer.

In the above alkaline aqueous solution, a surfactant, a defoaming agent and a small amount of an organic solvent for accelerating development may be mixed.

The aqueous developing solution comprises water or an alkaline aqueous solution and at least one organic solvent. Here, as an alkaline compound, there may be mentioned, in addition to the above compounds, for example, borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2 and morpholine.

It is desired that the pH of the developing solution is made as small as possible in the range in which development of a resist can be carried out sufficiently, and the pH is preferably 8 to 12, more preferably 9 to 10.

As the organic solvent, there may be mentioned, for example, triacetone alcohol, acetone, ethyl acetate, an alkoxyethanol having an alkoxy group with 1 to 4 carbon atoms, ethyl alcohol, isopropyl alcohol, butyl alcohol, diethylene glycol monomethyl ether, diethylene glycol monoethyl ether and diethylene glycol monobutyl ether. These organic solvents are used singly or in combination of two or more of them.

The concentration of the organic solvent is generally preferably 2 to 90% by weight, and the temperature can be adjusted depending on developability. Also, in the aqueous developing solution, small amounts of a surfactant and a defoaming agent may be mixed.

As the organic solvent type developing solution to be used singly, there may be mentioned, for example, 1,1,1-trichloroethane, N-methylpyrrolidone, N,N-dimethylformamide, cyclohexanone, methyl isobutyl ketone and γ-butyrolactone. For the purpose of preventing ignition, it is preferred to add water in an amount in the range of 1 to 20% by weight to these organic solvents.

Also, if necessary, two or more developing methods may be used in combination.

Further, after development, for the purpose of improving adhesiveness and chemical resistance of the patterned photosensitive resin composition, irradiation of UV ray by using a high pressure mercury lamp or the like and heating may be carried out. The irradiation dose of UV ray is generally about 0.2 to 10 J/cm, and at the time of irradiation, heating at 60 to 180° C. may be carried out. Either of the above irradiation of UV ray or heating may be carried out previously.

Further, when development is carried out by using the alkaline compound, after development, a step of neutralizing and removing a remaining alkaline compound may be added. For neutralization, an inorganic acid, an organic acid or both of them may be used, but an organic acid is generally used. As the, organic acid to be used, there may be mentioned, for example, a saturated aliphatic acid, an unsaturated aliphatic acid, an aliphatic dibasic acid, an aromatic dibasic acid, an aliphatic tribasic acid and an aromatic tribasic acid, specifically, for example, formic acid, acetic acid, chloroacetic acid, dichloroacetic acid, trichloroacetic acid, propionic acid, oxalic acid, malonic acid, methylmalonic acid, ethylmalonic acid, succinic acid, methylsuccinic acid, adipic acid, methyladipic acid, pimelic acid, suberic acid, azelaic acid, sebacic acid, maleic acid, itaconic acid, phthalic acid, isophthalic acid, terephthalic acid, trimellitic acid and citric acid.

Among them, from the point of a high neutralization effect, oxalic acid, malonic acid, methylmalonic acid, ethylmalonic acid, succinic acid, methylsuccinic acid and citric acid are preferred, and oxalic acid, malonic acid and citric acid are more preferred. These organic acids are used singly or in combination of two or more of them.

Further, after the step of neutralization, a step of water washing may be added.

A calcination method is not particularly limited, and by using a known calcination method, insolubles other than the phosphor can be removed to fix the phosphor in a PDP cell.

The calcination temperature is preferably 350 to 1,000° C., more preferably 400 to 650° C. The calcination time is preferably 5 to 120 minutes, more preferably 10 to 90 minutes.

A full color PDP can be prepared by using photosensitive resin compositions each containing a phosphor which emits red, blue or green light, coating the photosensitive resin compositions of the respective colors and then carrying out operations from development to calcination.

The process for preparing a fluorescent pattern of the present invention comprises laminating the photosensitive film of the present invention on a substrate for a plasma display panel, shifting a photosensitive layer of the photosensitive film on the surface of the substrate for a plasma display panel and carrying out exposure in a pattern state, development and then calcination.

In the lamination method, when a protective film exists on the photosensitive film, the photosensitive composition layer is formed after by removing the protective film and then laminating the photosensitive composition layer on the substrate by contact bonding (lamination) under heating.

Lamination is generally carried out under atmospheric pressure, but it may be also carried out under a reduced pressure of $5 \times 10^4$ Pa or less.

The temperature at the time of lamination is generally 80 to 120° C. Contact bonding is not particularly limited, but the linear pressure is generally preferably 50 to $1 \times 10^5$ N/m, more preferably 250 to $5 \times 10^4$ N/m, particularly preferably 500 to $1 \times 10^4$ N/m.

When the photosensitive composition layer is heated as described above, it is not necessary to subject the substrate to preheating treatment previously, but in order to further improve conformity, preheating treatment of the substrate may be carried out.

As a method for shifting the photosensitive layer of the photosensitive film on the surface of the substrate for a plasma display panel, there may be mentioned, for example, shifting by heating, shifting by pressurization (raising outside air pressure), shifting by embossing with an embossing die having a convex portion corresponding to a concave portion and shifting by rubbing using a roll or the like, and among them, shifting by heating is preferred.

As a method of shifting by heating, there may be mentioned, for example, a method in which the photosensitive resin composition is fluidized by heating and as shown in FIGS. 3 (b) to (d), the photosensitive resin composition is shifted from an opening to an inner portion along the surface (the barrier rib) of the substrate for a plasma display panel to form the photosensitive resin composition layer.

In FIG. 3, 1 is a substrate, 2 is a barrier rib, 5 is a photosensitive resin composition, 5' is a portion at which a photosensitive resin composition is thin, and 6 is a support film.

The above heating temperature is preferably 80 to 150° C., more preferably 100 to 130° C. If the heating temperature is lower than 80° C., the photosensitive resin composition tends to be not fluidized sufficiently to lower conformity, while if it exceeds 150° C., the photosensitive resin composition tends to be modified, and photosensitive characteristics such as sensitivity and resolution tend to be lowered.

Also, at the time of heating, the support film of the photosensitive film may be or may not be peeled off, but from the point that fluidization can be effected smoothly, it is preferred to carry out heating after the support film is peeled off.

In the step shown in FIG. 3, heating is carried out after the support film is peeled off.

Figure 3A:
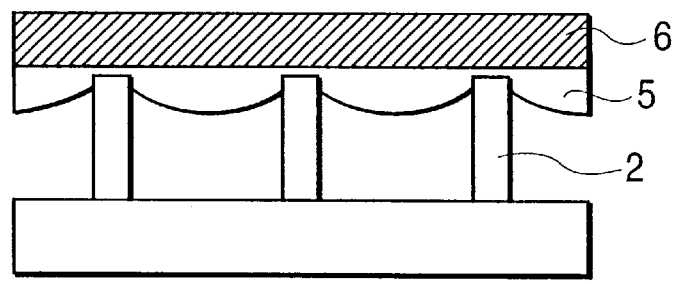
FIG. 3 is a schematical view showing a shifting step of a photosensitive resin composition layer.
Figure 3B:
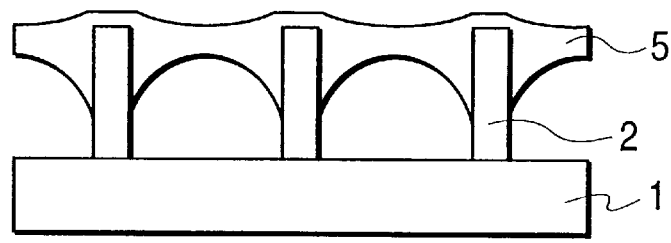
Figure 3C:
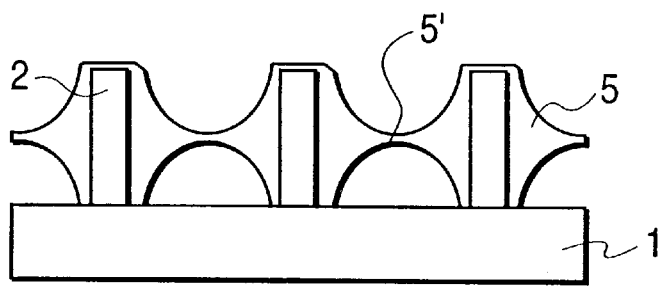
Figure 3D:
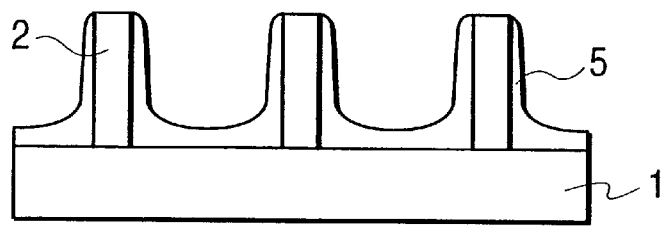

A time required for shifting the photosensitive resin composition from a state of FIG. 3(a) to a state of FIG. 3(d) depends on the height of the barrier rib, the shape and size of the discharge space, the heating temperature, the thickness and viscosity of the photosensitive resin composition and the above lamination conditions. Therefore, by actually measuring the time required for shifting the photosensitive resin composition from a state of FIG. 3(a) to a state of FIG. 3(d), a heating time is determined. The heating time is generally 1 minute to 10 hours.

When the above lamination step is carried out under reduced pressure, the time required for shifting the photosensitive resin composition from a state of FIG. 3(a) to a state of FIG. 3(d) is shortened.

Exposure is carried out with active light through a photomask in the same manner as in the above exposure method. When the support film exists on the photosensitive resin composition layer and when the support film is transparent, exposure can be carried out without removing the support film, and when the support film is opaque, it is necessary to remove the support film as a matter of course.

The exposure dose of the active light is not particularly limited, and it is preferably 3 mJ to 3,000 mJ, more preferably 5 mJ to 2,000 mJ, particularly preferably 10 mJ to 1,000 mJ.

The exposure sensitivity of the photosensitive film of the present invention measured by using Kodak step tablet No. 2 (trade name, produced by Eastman Kodak Co., a step tablet of 21 grades) is preferably in the range of 1 to 21 grades, more preferably in the range of 1.5 to 18 grades, particularly preferably in the range of 2 to 15 grades.

With respect to the resolution of the photosensitive film of the present invention measured by using a negative mask for testing (produced by Hitachi Chemical Co., Ltd.), line/space (μm) is preferably 1,000/1,000 or less, more preferably 900/900 or less, particularly preferably 800/800 or less.

With respect to the adhesiveness of the photosensitive film of the present invention measured by using a negative mask for testing (produced by Hitachi Chemical Co., Ltd.), line/space (μm) is preferably 400/400 or less, more preferably 350/400 or less, particularly preferably 300/400 or less.

After exposure, when the support film exists on the photosensitive resin composition layer, the support film is removed, and then development is carried out in the same manner as in the above developing method. Further, when development is carried out by using the alkaline compound, after exposure, a step of neutralizing and removing a remaining alkaline compound may be added. Further, after the step of neutralization, a step of water washing may be added.

Calcination is also carried out in the same manner as in the above calcination method.

A full color PDP can be prepared by using photosensitive films each containing a phosphor which emits red, blue or green light and repeating a series of operations from lamination to calcination described above.

If necessary, a full color PDP can be also prepared by using photosensitive films each containing a phosphor which emits red, blue or green light, repeating a series of operations from lamination to a step prior to calcination described above and then carrying out the above calcination.

Figure 4:
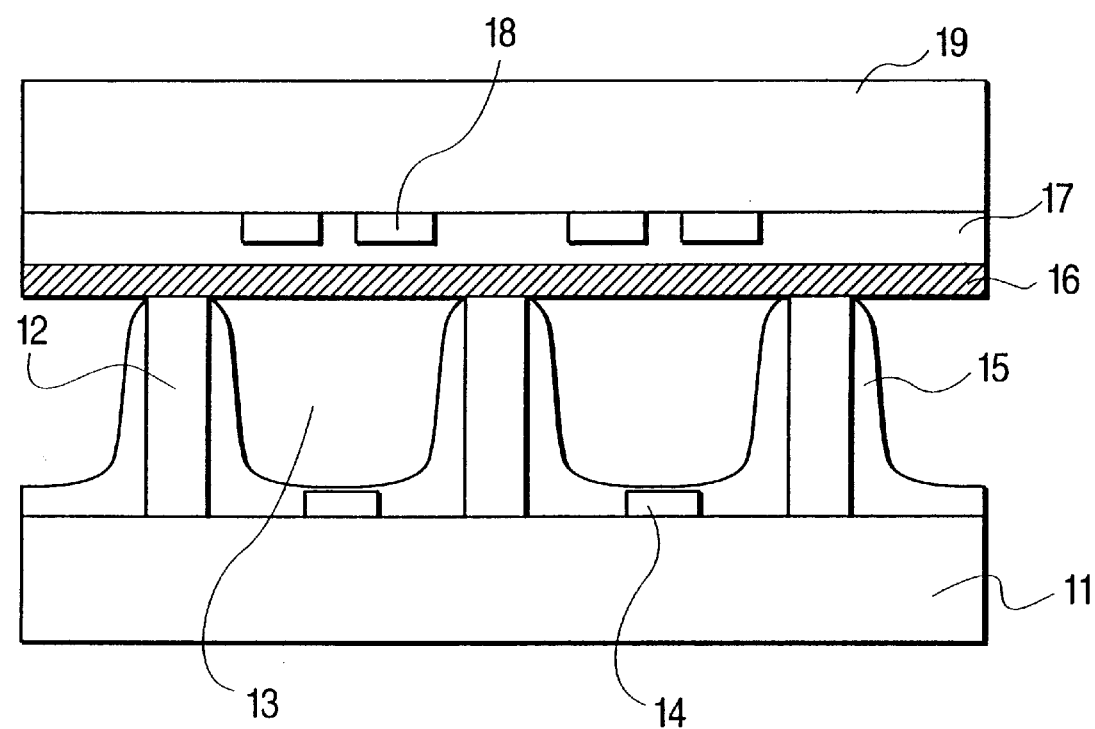
FIG. 4 is a schematic view showing a plasma display panel for an alternating current.

FIG. 4 is a schematic drawing showing a PDP for an alternating current in which the reference numeral 11 is a substrate (or a back plate glass substrate), 12 is a barrier rib, 13 is a discharge space, 14 is an electrode for address, 15 is a photosensitive resin composition including phosphor, 16 is a protective film, 17 is a dielectric material layer, 18 is a display electrode (a transparent electrode) and 19 is a front glass substrate.

In this figure, the front plate is the portion upper than the protective film 16 (inclusive) and the back plate is the portion not upper than the protective film 16 (exclusive).

In FIG. 4, an embodiment of applying the present invention to an alternating current PDP is shown, but the composition of the present invention can be also applied to a PDP for a direct current.

EXAMPLES

The present invention is described in detail by referring to Examples.

Example 1

(Preparation of Phosphor (I) Subjected to Surface Treatment with a Compound having a Carboxyl Group)

An eggplant type flask of 300 ml was charged with 100.0 g of a phosphor (ZnO:Zn (green)), 200.0 g of acetone and 0.5 g of oxalic acid, and mounted to a rotary evaporator.

After the mixture was stirred by rotating the flask at 30° C. for 3 hours, acetone was removed under reduced pressure to obtain Phosphor (I) subjected to surface treatment.

Example 2

(Preparation of Phosphor (II) Subjected to Surface Treatment with a Compound having a Carboxyl Group)

An eggplant type flask of 300 ml was charged with 100.0 g of a phosphor (ZnSiO:Mn (green)), 200.0 g of acetone and 0.5 g of malonic acid, and mounted to a rotary evaporator.

After the mixture was stirred by rotating the flask at 30° C. for 3 hours, acetone was removed under reduced pressure to obtain Phosphor (II) subjected to surface treatment.

Resin Preparation Example 1

A flask equipped with a stirrer, a reflux condenser, an inert gas-introducing inlet and a thermometer was charged with 100 parts by weight of diethylene glycol monobutyl ether, the temperature was raised to 80° C. under nitrogen gas atmosphere, and while maintaining the reaction temperature at 80° C.±2° C., a mixture of 22 parts by weight of methacrylic acid, 55 parts by weight of methyl methacrylate, 8 parts by weight of n-butyl methacrylate, 15 parts by weight of 2-ethylhexyl acrylate and 0.6 part by weight of 2,2'-azobis (isobutyronitrile) was uniformly added dropwise to the mixture in the flask over 4 hours.

After the above dropwise addition, the mixture was stirred at 80° C.±2° C. for 6 hours to obtain a copolymer having a weight average molecular weight (Mw) of 80,000 and an acid value of 143 mgKOH/g (solid component).

Examples 3 to 6 and Comparative Example 1 and 2

Operations of mixing materials shown in Table 1 for 5 minutes by using a stirring machine and then leaving the mixtures to stand for 1 minute were repeated three times to prepare photosensitive resin composition solutions.

TABLE 1

(unit: part by weight)

| Photosensitive resin composition | | Example 3 | Example 4 | Example 5 | Example 6 | Comparative example 1 | Comparative example 2 |
|---|---|---|---|---|---|---|---|
| Component (A) | Oxalic acid | 0.3 | — | — | — | — | — |
| | Malonic acid | — | 0.3 | — | — | — | — |
| Component (B) | Resin obtained in Resin preparation example 1 | 60.0 (solid component: 30.0) | 60.0 (solid component: 30.0) | 60.0 (solid component: 30.0) | 60.0 (solid component: 30.0) | 60.0 (solid component: 30.0) | 60.0 (solid component: 30.0) |
| Component (C) | Polytetraethylene glycol dimethacrylate (average number of ethylene oxides: 4) | 18.0 | 18.0 | 18.0 | 18.0 | 18.0 | 18.0 |
| Component (D) | Benzophenone | 2.5 | 2.5 | 2.5 | 2.5 | 2.5 | 2.5 |
| | Dimethylaminobenzophenone | 0.06 | 0.06 | 0.06 | 0.06 | 0.06 | 0.06 |

TABLE 1-continued (unit: part by weight)

| Photosensitive resin composition | | Example 3 | Example 4 | Example 5 | Example 6 | Comparative example 1 | Comparative example 2 |
|---|---|---|---|---|---|---|---|
| Component (E) | Phosphor (I) obtained in Example 1 | — | — | 84.0 | — | — | — |
| | Phosphor (II) obtained in Example 2 | — | — | — | 84.0 | — | — |
| | ZnO:Zn (green) (untreated) | 84.0 | — | — | — | 84.0 | — |
| | Zn$_2$SiO$_4$:Mn (green) (untreated) | — | 84.0 | — | — | — | 84.0 |
| Solvent | Diethylene glycol monobutyl ether | 14.0 | 14.0 | 14.0 | 14.0 | 14.0 | 14.0 |
| Binder | Low melting point glass | 0.9 | 0.9 | 0.9 | 0.9 | 0.9 | 0.9 |

Comparative Example 3

According to the method described in Japanese Provisional Patent Publication No. 273925/1994, operations of mixing materials shown in Table 2 for 5 minutes by using a stirring machine and then leaving the mixture to stand for 1 minute were repeated three times to prepare a photosensitive resin composition solution.

TABLE 2

| Photosensitive resin composition | | (unit: part by weight) Comparative example 3 |
|---|---|---|
| Component (B) | Resin obtained in Resin preparation example 1 | 92.0 (solid component: 46.0) |
| Component (C) | Trimethylolpropane triacrylate | 30.0 |
| | Polyethylene glycol (600) dimethacrylate | 15.0 |
| | Ethylene oxide-modified phthalic acid acrylate | 9.00 |
| Component (D) | Benzophenone | 7.00 |
| | p,p'-Dimethylaminobenzophenone | 0.13 |
| | 2,2-Bis(o-chlorophenyl)-4,5,4',5'-tetraphenyl-1,2'-biimidazole | 0.87 |
| Component (E) | ZnGeO:Mn (green) | 26.0 |

Storage Stability Test

The viscosities of the solutions containing the photosensitive resin compositions prepared in Examples 3 to 6 and Comparative examples 1 to 3 described above were measured at 25° C., and then the solutions were stored in sample bottles which were tightly closed, in a thermostatic chamber at 40° C. for 7 days. After storage, the viscosities were measured at 25° C., and storage stability was tested by change from the initial viscosities immediately after preparation and the viscosities after storage. The results are shown in Table 3.

TABLE 3

| Photosensitive resin composition | Viscosity change (Pa · s) | |
|---|---|---|
| | Initial viscosity | Viscosity after 7 days |
| Example 3 | 53.5 | 54.2 |
| Example 4 | 53.7 | 54.0 |
| Example 5 | 54.6 | 55.1 |
| Example 6 | 55.8 | 55.9 |

TABLE 3-continued

| Photosensitive resin composition | Viscosity change (Pa · s) | |
|---|---|---|
| | Initial viscosity | Viscosity after 7 days |
| Comparative example 1 | 54.7 | 95.9 |
| Comparative example 2 | 53.7 | 82.2 |
| Comparative example 3 | 21.3 | 56.2 |

From Table 3, it can be seen that the photosensitive resin compositions (Examples 3 to 6) of the present invention have good storage stability and are suitable as a photosensitive composition. On the other hand, it can be seen that the photosensitive resin compositions (Comparative examples 1 to 3) in which Component (A) is not contained and a phosphor subjected to surface treatment with the compound (F) having a carboxyl group is not used are thickened and unsuitable as a photosensitive composition.

Examples 7 to 10

The solutions containing the photosensitive resin compositions obtained in Examples 3 to 6 were coated on a glass substrate having a lattice-shaped opening with a length of 200 μm, a width of 250 μm and a height of 150 μm and having a barrier rib for PDP formed thereon, respectively, by using a screen printer (trade name: LS-77A Model, produced by Newlong Seimitsu Kogyo Co., Japan) so that a dry film thickness became 60 μm.

The substrates with the opening sides of the barrier ribs facing upward were dried by heating at 120° C. for 10 minutes and then left to stand at ordinary temperature for 1 hour.

Next, a mask for testing having a light-shielding portion with a diameter of 120 μm was adhered to the opening side of each barrier rib while the mask was adjusted to the center of the opening of the barrier rib. By using a HMW-590 Model parallel ray exposer (trade name) produced by Orc Seisakusho Co., Japan, 0.5 J/cm of UV ray was irradiated.

The substrates were left to stand at ordinary temperature for 15 minutes and then subjected to spray development at 30° C. for 70 seconds by using a 1% by weight sodium carbonate aqueous solution.

After development, the substrates were dried at 80° C. for 10 minutes, and by using a Toshiba UV ray irradiation apparatus produced by Toshiba Denzai Co., Japan, 3 J/cm of UV ray was irradiated.

After irradiation, heating treatment (calcination) was carried out at 450° C. for 30 minutes, and unnecessary resin components were removed to form fluorescent patterns in PDP cells.

The fluorescent patterns obtained were observed by a stereoscopic microscope and a scanning type electron microscope (SEM) to evaluate the formation states of the fluorescent patterns. The results are shown in Table 4.

Comparative Examples 4 to 6

The photosensitive resin compositions obtained in Comparative examples 1 to 3 were treated by using the same steps as in Example 7 to form fluorescent patterns in PDP cells.

The fluorescent patterns obtained were observed by a stereoscopic microscope and SEM to evaluate the formulation states of the fluorescent patterns. The results are shown in Table 4.

TABLE 4

|  | Photosensitive resin composition | Formation state of phosphor layer |
| --- | --- | --- |
| Example 7 | Example 3 | Good |
| Example 8 | Example 4 | Good |
| Example 9 | Example 5 | Good |
| Example 10 | Example 6 | Good |
| Comparative example 4 | Comparative example 1 | An undeveloped portion was generated at an unexposed portion. |
| Comparative example 5 | Comparative example 2 | An undeveloped portion was generated at an unexposed portion. |
| Comparative example 6 | Comparative example 3 | An undeveloped portion was generated at an unexposed portion. |

From Table 4, when the photosensitive resin compositions of the present invention were used (Examples 7 to 10), good phosphor layers were formed. On the other hand, in the photosensitive resin compositions (Comparative examples 4 to 6) in which Component (A) was not contained and a phosphor subjected to surface treatment with the compound (F) having a carboxyl group was not used, undeveloped portions were generated at unexposed portions, whereby no complete fluorescent pattern was obtained.

Examples 11 to 14

The photosensitive resin compositions obtained in Examples 3 to 6 were uniformly coated on a polyethylene terephthalate film having a thickness of 20 μm, respectively, and dried for 10 minutes by using a hot air convection type dryer at 80 to 110° C. to remove the solvent. The film thickness after drying of the photosensitive resin composition layers obtained was 60 μm.

Further, a polyethylene film having a thickness of 25 μm as a cover film was adhered to the photosensitive composition layers, respectively, to obtain photosensitive films.

The photosensitive films obtained were laminated on a glass substrate having a lattice-shaped opening with a length of 200 μm, a width of 250 μm and a height of 150 μm and having a barrier rib for PDP formed thereon, respectively, by using a vacuum laminator (trade name: VLM-1 Model, produced by Hitachi Chemical Co., Ltd.) at a heat shoe temperature of 120° C. and a lamination rate of 0.5 m/s under an atmospheric pressure of 4,000 Pa or less and a contact bonding pressure of $3\times10^5$ Pa while the polyethylene films were peeled off.

Next, the polyethylene terephthalate films at the upper side were peeled off, and the substrates with the opening sides of the barrier ribs facing upward were heated at 120° C. for 30 minutes and then left to stand at ordinary temperature for 1 hour.

Next, a mask for testing having a light-shielding portion with a diameter of 120 μm was adhered to the opening side of each barrier rib while the mask was adjusted to the center of the opening of the barrier rib. By using a HMW-590 Model parallel ray exposer (trade name) produced by Orc Seisakusho Co., Japan, 0.5 J/cm of UV ray was irradiated.

The substrates were left to stand at ordinary temperature for 15 minutes and then subjected to spray development at 30° C. for 70 seconds by using a 1% by weight sodium carbonate aqueous solution.

After development, the substrates were dried at 80° C. for 10 minutes, and by using a Toshiba UV ray irradiation apparatus produced by Toshiba Denzai Co., Japan, 3 J/cm of UV ray was irradiated.

After irradiation, heating treatment (calcination) was carried out at 450° C. for 30 minutes, and unnecessary resin components were removed to form fluorescent patterns in PDP cells.

The fluorescent patterns obtained were observed by a stereoscopic microscope and SEM to evaluate the formation states of the fluorescent patterns. The results are shown in Table 5.

Comparative Examples 7 to 9

The photosensitive resin compositions obtained in Comparative examples 1 to 3 were treated by using the same steps as in Example 11 to form photosensitive films and form fluorescent patterns in PDP cells.

The fluorescent patterns obtained were observed by a stereoscopic microscope and SEM to evaluate the formulation states of the fluorescent patterns. The results are shown in Table 5.

TABLE 5

|  | Photosensitive resin composition | Formation state of phosphor layer |
| --- | --- | --- |
| Example 11 | Example 3 | Good |
| Example 12 | Example 4 | Good |
| Example 13 | Example 5 | Good |
| Example 14 | Example 6 | Good |
| Comparative example 7 | Comparative example 1 | An undeveloped portion was generated at an unexposed portion. |
| Comparative example 8 | Comparative example 2 | An undeveloped portion was generated at an unexposed portion. |
| Comparative example 9 | Comparative example 3 | An undeveloped portion was generated at an unexposed portion. |

From Table 5, when the photosensitive films of the present invention were used (Examples 11 to 14), good phosphor layers were formed. On the other hand, in the photosensitive resin compositions (Comparative examples 7 to 9 in which Component (A) was not contained and a phosphor subjected to surface treatment with the compound (F) having a carboxyl group was not used, undeveloped portions were generated at unexposed portions, whereby no complete fluorescent pattern was obtained.

The photosensitive composition according to Claim 1 is not thickened for a long time and has excellent storage stability.

The photosensitive film according to Claim 2 can be used for a long time and has excellent storage stability.

The process for preparing a fluorescent pattern according to Claim 3 can provide a fluorescent pattern having a good pattern shape.

The process for preparing a fluorescent pattern according to Claim 4 has excellent operatability and environmental safety and can provide a fluorescent pattern having a good pattern shape.

The photosensitive composition according to Claim 5 is not thickened for a long time and has excellent storage stability.

The photosensitive film according to Claim 6 can be used for a long time and has excellent storage stability.

The process for preparing a fluorescent pattern according to Claim 7 can provide a fluorescent pattern having a good pattern shape.

The process for preparing a fluorescent pattern according to Claim 8 has excellent operatability and environmental safety and can provide a fluorescent pattern having a good pattern shape.

The phosphor subjected to surface treatment according to Claim 9 is not thickened and has excellent storage stability even when the phosphor is dispersed by using a resin having a carboxyl group, and is suitable for a photosensitive resin composition and a photosensitive film and also suitable for preparing a fluorescent pattern using the same.

The process for preparing a phosphor subjected to surface treatment according to Claim 10 can provide a phosphor subjected to surface treatment, which is not thickened and has excellent storage stability even when the phosphor is dispersed by using a resin having a carboxyl group.

What is claimed is:

1. A back plate for a plasma display panel which comprises using a photosensitive resin composition comprising
   (A) a compound having a carboxyl group;
   (B) a resin having a carboxyl group;
   (C) a photopolymerizable unsaturated compound having an ethylenic unsaturated group;
   (D) a photopolymerization initiator which produces free radical by irradiation of active light; and
   (F) a phosphor.

2. A process for producing a back plate for a plasma display panel, which comprises coating the composition according to claim 1 on a substrate having a barrier rib for a plasma display panel and carrying out drying, exposure in a pattern state, development and then calcination.

3. A back plate for a plasma display panel which is produced by the process according to claim 2.

4. A process for producing a back plate for a plasma display panel, which comprises laminating a film comprising a layer of the composition according to claim 1 and a support film which supports the layer on a substrate having a barrier rib for a plasma display panel, shifting a photosensitive layer of the film on the surface of the substrate for a plasma display panel and carrying out exposure in a pattern state, development and then calcination.

5. A back plate for a plasma display panel which is produced by the process according to claim 4.

6. A plate for a display panel which comprises using a photosensitive resin composition comprising
   (A) a compound having a carboxyl group;
   (B) a resin having a carboxyl group;
   (C) a photopolymerizable unsaturated compound having an ethylenic unsaturated group;
   (D) a photopolymerization initiator which produces free radical by irradiation of active light; and
   (F) a phosphor.

7. A process for producing a plate for a display panel, which comprises laminating a film comprising a layer of a photosensitive composition comprising:
   (A) a compound having a carboxyl group;
   (B) a resin having a carboxyl group;
   (C) a photopolymerizable unsaturated compound having an ethylenic unsaturated group;
   (D) a photopolymerization initiator which produces free radicals by irradiation of active light; and
   (F) a phosphor,
and a support film which supports the layer on a substrate for a display panel, shifting a photosensitive layer of the film on the surface of the substrate for a display panel and carrying out exposure in a pattern state, development and then calcination.

8. A plate for a display panel which is produced by the process according to claim 7.

9. A phosphor pattern which is produced by the process comprising the steps of coating a composition comprising
   (A) a compound having a carboxyl group;
   (B) a resin having a carboxyl group;
   (C) a photopolymerizable unsaturated compound having an ethylenic unsaturated group;
   (D) a photopolymerization initiator which produces free radical by irradiation of active light; and
   (F) a phosphor on a substrate and carrying out drying, exposure in a pattern state, development and then calcination.

10. A phosphor pattern which is produced by the process comprising the steps of laminating a film which comprises a layer of the composition according to claim 9 and a support film which supports the layer on a substrate, shifting a photosensitive layer of the film on the surface of the substrate for a display panel and carrying out exposure in a pattern state, development and then calcination.

* * * * *